United States Patent [19]
Shoemaker et al.

[11] Patent Number: 5,890,059
[45] Date of Patent: Mar. 30, 1999

[54] IMPULSE NOISE BLANKING APPARATUS

[75] Inventors: Michael Allen Shoemaker, Camden; Michael John Easterwood; Jeffrey M. Stricker, both of Kokomo, all of Ind.

[73] Assignee: Delco Electronics Corporation, Kokomo, Ind.

[21] Appl. No.: 734,509

[22] Filed: Oct. 21, 1996

[51] Int. Cl.$^6$ .................................................. H04B 1/18
[52] U.S. Cl. ........................... 455/297; 455/223; 455/298
[58] Field of Search .................................... 455/296, 297, 455/298, 299, 212, 213, 218, 219, 220, 222, 224, 225; 375/346, 350, 351

[56] References Cited

U.S. PATENT DOCUMENTS

| | | | |
|---|---|---|---|
| 4,029,969 | 6/1977 | Kondo et al. | 307/10 R |
| 4,347,827 | 9/1982 | LoCascio | 123/618 |
| 4,451,764 | 5/1984 | Gerry | 315/209 |
| 4,521,917 | 6/1985 | Holt, Jr. | 455/223 |
| 4,525,870 | 7/1985 | Fukuhara et al. | 455/297 |
| 4,688,265 | 8/1987 | Chemelewski | 455/223 |
| 4,704,736 | 11/1987 | Kasser | 455/213 |
| 5,255,319 | 10/1993 | Nakamura et al. | 381/13 |

*Primary Examiner*—Thanh Cong Le
*Attorney, Agent, or Firm*—Jimmy L. Funke

[57] ABSTRACT

A method and apparatus for suppressing noise in a radio receiver or the like due to electromagnetic interference generated by the firing of a spark plug which coordinates the operation of a noise blanker with the EST signal generated by an electronic engine control module or similar spark timing signal. The apparatus of the present invention comprises a noise blanker disposed within a radio receiver for blanking the output of the radio receiver for a predetermined duration after a predetermined time delay has elapsed after each EST signal pulse. The noise blanker is activated for a time duration slightly longer than the duration of the impulse noise. The noise blanker may also be designed to be deactivated when the desired signal level reaches a predetermined level. The apparatus of the present invention may be used in conjunction with other noise suppression systems to eliminate noise due to sources other than the electronic ignition system.

23 Claims, 2 Drawing Sheets

IMPULSE NOISE BLANKING APPARATUS

BACKGROUND OF THE INVENTION

1. Field of the Invention

This invention relates to a method and an apparatus for suppressing noise in a radio receiver, and more particularly to suppressing noise due to electromagnetic interference generated by an ignition system that creates an electric spark to ignite a fuel/air mixture.

2. Description of the Related Art

The operation of radio receivers near ignition systems which create an electric spark to ignite a fuel/air mixture has always proved difficult because of the electromagnetic interference generated by such ignition systems. These ignition systems are commonly found in gasoline powered internal combustion engines used in automobiles, aircraft, marine vehicles, and other transportation media. The electric spark used in these engines, as well as the current flowing in the cables from the power source to the spark plug, generate electrical interference which is picked up by the vehicle's radio receiving antenna.

The interference picked up by the radio receiver from the ignition system is commonly known as impulse noise and causes a "popping" sound from the loudspeaker. In instances of lesser interference, this popping sound is merely annoying to the listener, but larger interference can render the radio unusable.

The traditional methods of controlling impulse noise have attempted to either prevent the coupling of the electrical interference with the receiving antenna or use a blanking circuit to prevent the flow of radio signals to the audio amplifier when the detected impulse noise reaches a predetermined level.

Attempts to decouple the electrical interference with the receiving antenna have included, among other methods, shielding the antenna from the interference source, grounding the engine to the vehicle body or frame, and locating the antenna at a location having reduced likelihood for electromagnetic interference pick up. These techniques merely reduce, but do not eliminate the pick up of interference by the antenna. Unfortunately, modern engines use very high levels of spark energy to improve operating efficiency and the above noted methods are not very effective in suppressing the pick up of impulse noise by the antenna.

On the other hand, noise blanking systems employ a blanking circuit disposed between a signal processing unit and a signal amplifying unit to prevent the impulse noise from reaching the amplifying stage when the detected impulse noise reaches a predetermined level. The noise blanking systems used today selectively activate the blanking function based on the detected presence of interference in the incoming signal. When interference of sufficient magnitude is detected, the blanking system sets a "flag" which activates the blanking function.

AM receivers use a single flag, commonly known as an automatic gain control (AGC) derived flag, which is derived from a sudden increase in signal level. FM receivers use two flags, an AGC derived flag like the AM receivers plus a high frequency audio information flag, which is created when a high frequency noise "pop" is detected. In a FM receiver, either or both flags may be used to control the noise blanking circuit.

However, the noise blanking systems used today have several shortcomings. First, these noise blanking systems are only effective for noise above a given threshold level. Incoming noise which is slightly below the threshold level will still reach the signal amplifying stage and may be heard on the loudspeaker. This is especially a problem when the desired signal level is low or close to the noise threshold level. Second, in situations where the desired signal level is moderate, the AGC circuitry will be desensitized by the moderate signal and no flags may be generated. In such a situation, "popping" noises will easily be heard from the loudspeaker. Limitations of AGC systems are commonly known and described in the literature. Third, since the levels of a series of impulses created while the engine is running will not all be identical, certain pulses may "escape" and be heard on the speaker because the pulse level was too low to create a flag. Further, on FM systems, certain lower energy pulses will not create enough high frequency energy to be detected by the secondary loop and thus escape.

Thus, conventional noise suppression systems are not totally effective in eliminating all impulse noises caused by electromagnetic interference generated by a vehicle's engine ignition system.

SUMMARY OF THE INVENTION

An objective of the present invention is to provide a noise suppression system for a radio receiver which effectively eliminates all impulse noise caused by electromagnetic interference generated by an engine's ignition system regardless of the desired signal strength and interference levels picked up by the antenna.

The present invention provides a method and a combination for effectively suppressing all electromagnetic interference generated by an engine ignition system by timing the activation of a noise blanking circuit by the spark event which generates the electromagnetic interference rather than by the detection of noise of a predetermined threshold level.

The present inventional combination for noise suppression comprises a noise blanker coupled with a radio receiver and an electronic control module (ECM) of an engine's electronic ignition system wherein the noise blanker interrupts the flow of antenna received signals through the radio receiver when the ECM outputs an ignition signal to trigger the firing of a spark plug. Since the noise blanker is directly coupled to the ECM output, the noise blanker can prevent the flow of impulse noise to the audio amplifier every time the ignition system generates impulse noise. A delay circuit may be included between the ECM and the noise blanker to ensure that the blanking function occurs precisely when the impulse noise propagates to the noise blanker.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawing, wherein.

The exemplification set out herein illustrates an embodiment of the invention, in one form, and such exemplification is not to be construed as limiting the scope of the invention in any manner.

DETAILED DESCRIPTION OF THE INVENTION

The embodiment disclosed below is not intended to be exhaustive or limit the invention to the precise form disclosed in the following detailed description. Rather, the embodiment is chosen and described so that others skilled in the art may utilize its teachings.

The method and combination of the present invention utilizes the timing of the ignition signal outputted by an ECM (or other spark timing circuitry) to control the operation of a blanking circuit. Such an arrangement effectively suppresses all impulse noise caused by electromagnetic interference generated by an electronic ignition system.

Figure 1:
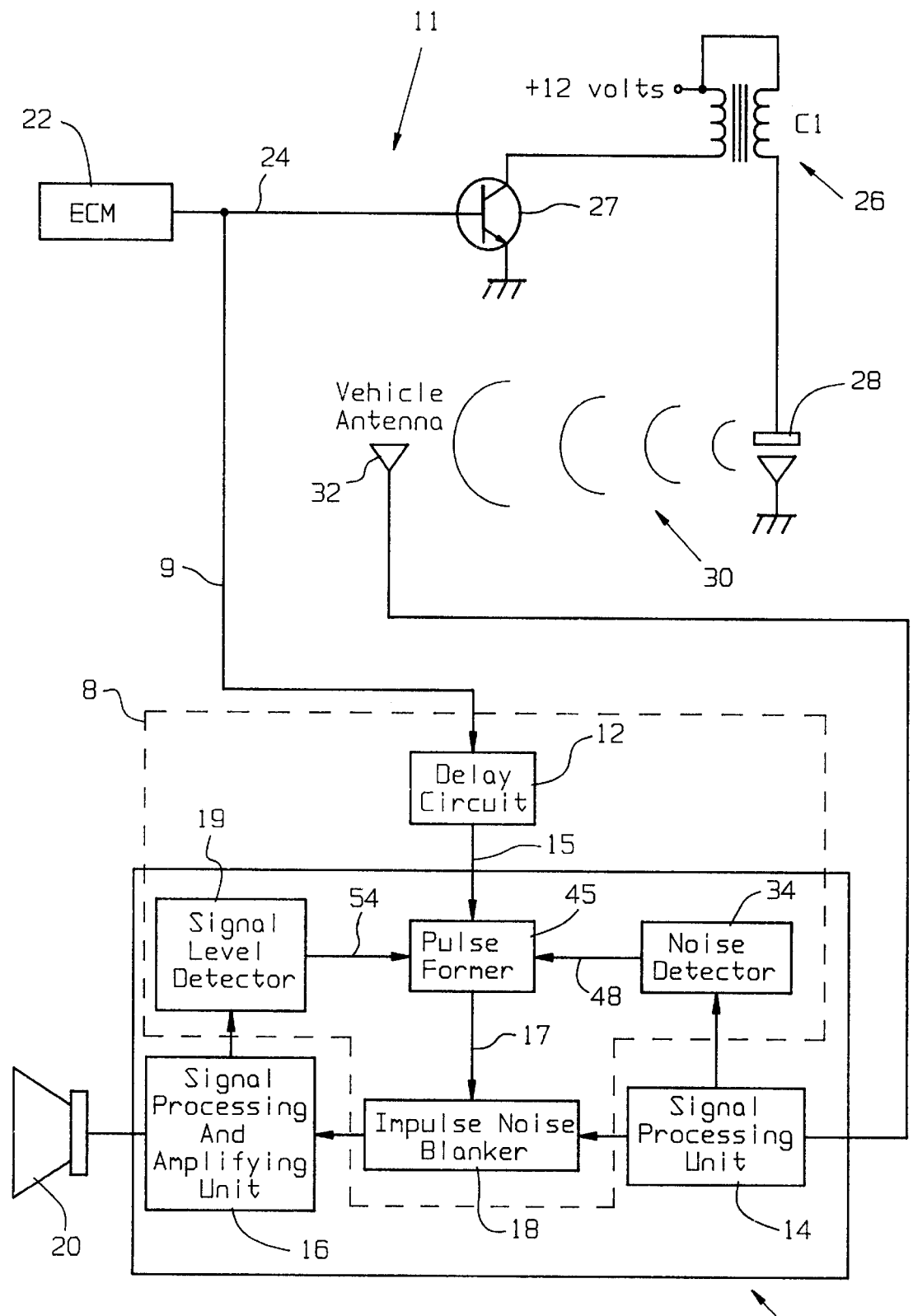
FIG. 1 is a block diagram and partial schematic diagram of the noise suppression system of the present invention.

Referring to FIG. 1, the noise suppression system according to a preferred embodiment of the present invention comprises a noise blanking apparatus 8 having impulse noise blanker 18, disposed within radio receiver unit 10, which interrupts the flow of antenna received signals from signal processing unit 14 to signal processing and amplifying unit 16. Noise blanker 18 is connected with output 24 of ECM 22 of electronic ignition system 11 via pulse former 45, delay circuit 12 and activating input 9. Noise blanking apparatus 8 also includes noise level detector 34 and signal level detector 19 which activate and deactivate noise blanker 18, respectively, based on the noise level and signal strength.

Electronic ignition system 11 comprises ECM 22 coupled to one of a plurality of spark plugs 28 via ignition coil 26 and ignition system coil driver module 27. For clarity, other connections to ECM 22 are not shown. ECM 22 may comprise any one of a number of conventionally known electronic engine control modules or other mechanical means used to control the operation, particularly the spark plug timing sequence, of an internal combustion engine. ECM 22 outputs an Engine Spark Timing (EST) signal to trigger the firing of a spark plug. ECM 22 provides an EST signal, via EST signal line 24, to drive ignition coil driver module 27 to trigger the flow of current through ignition coil 26 and fire spark plug 28. Ignition coil driver module 27 may comprise any conventionally known device for controlling the flow of current to an ignition coil, for example a bipolar transistor.

The operation of ignition system 11 during normal engine operation is as follows. ECM 22 provides a periodic EST pulse signal to trigger the firing of spark plug 28. When the EST pulse is positive, ignition coil driver module 27 is saturated allowing current to flow through the primary winding of ignition coil 26. When the EST pulse drops to zero, ignition coil driver module 27 shuts off, cutting off the current flow through the primary winding of ignition coil 26. The rapid change in the current causes a high voltage to be developed in the secondary winding of ignition coil 26, which is discharged by the firing of spark plug 28.

When spark plug 28 fires, RF impulse noise 30 radiates from the electrical spark and the wiring associated with the ignition system due to the high current flowing through the wiring. Impulse noise 30 is then picked up by vehicle antenna 32 and directed to radio signal processing unit 14 of radio receiver unit 10.

As further indicated in FIG. 1, impulse noise blanker 18 is disposed between signal processing unit 14 and signal processing and amplifying unit 16 and controls the flow of radio signals from signal processing unit 14 to signal processing and amplifying unit 16. When impulse noise blanker 18 is inactive, processed radio signals flow to signal processing and amplifying unit 16, are amplified, and outputted via speaker 20. When impulse noise blanker 18 is activated, the flow of processed radio signals to signal processing and amplifying unit 16 is interrupted. Noise blankers are well known in the art and any one of a number of conventionally known noise blankers may be used with the present invention. Such noise blankers include, but are not limited to the noise blanker circuit disclosed and discussed below.

Impulse noise blanker 18 is activated as follows. When an EST signal is present on ECM output 24, activating input 9 provides a signal to delay circuit 12 which activates pulse former 45 following a predetermined time delay. When activated, pulse former 45 generates a blanking flag at pulse former output 17 to activate noise blanker 18. The activation of noise blanker 18 interrupts the flow of antenna received signals through radio receiver 10. The blanking flag is a uniform pulse of a predetermined duration. The duration of the blanking flag is set long enough to ensure that the impulse noise is removed, and short enough that the desired signal is not excessively degraded. Experimental results have shown that a duration of about 40 $\mu$S is sufficient to meet these requirements.

A time delay between the outputting of an EST signal by ECM 22 and the setting of the blanking flag is necessary due to the interval between the time an EST signal is generated, the spark plug fires, and the impulse noise travels down the signal processing chain to impulse noise blanker 18. The time delay is set such that the impulse noise arrives at noise blanker 18 at precisely the same time noise blanker 18 is activated. Without this time delay, the impulse noise may not be properly eliminated and/or the desired signal may be erroneously eliminated. In vehicle experiments using the preferred embodiment of the present invention, this time delay has been determined to be about 70 $\mu$S. However, the time delay may depend on the specific implementation, for example a particular integrated circuit design may include parasitic capacitances which alter the desired delay time, and may require experimentation to determine the optimum value.

Delay circuits which provide a suitable time delay are well known in the art and any such suitable delay circuit, in addition to the delay circuit described further below, may be used with the present invention. Such delay circuits include, but are not limited to, any common RC network whose time constant is chosen to generate the appropriate delay. The delay may also be implemented integrally within the ECM, for example by using embedded software, such that a blanking flag is automatically generated and outputted by the ECM following the outputting of an EST signal.

Additionally, the present inventional combination for noise suppression includes signal level detector 19 which overrides the noise blanking action when the desired signal level reaches a level sufficient to cover up the interference. It is desirable to override noise blanker 18 when the desired signal reaches such a level since the blanking action is no longer necessary and may unnecessarily degrade the signal. This feature resets pulse former 45 to prevent the blanking flag from being generated when the radio receiver's automatic gain control (AGC) reaches a predetermined level. In experiments with a 1996 Buick LeSabre car modified to produce high levels of ignition interference, it was found to be desirable to override the blanking action at about 500 $\mu$V of desired signal.

As further shown in FIG. 1, the present inventional combination for noise suppression also includes a feature for activating the noise blanker when the noise level exceeds a predetermined level regardless of the presence of an EST signal on output line 24. This feature is implemented by noise detector 34 which receives noise level input from signal processing unit 14 and provides the noise level output at output line 48 to activate pulse former 45 when the noise level exceeds a predetermined noise level. This feature is useful in blanking other interference events such as switch pops, power lines, other vehicles, etc.

Further details of the present invention are now described with reference to FIG. 2. The preferred embodiment comprises radio receiver section 33 of radio receiver 10, noise detector 34, delay circuit 12 and pulse former 45. Radio receiver section 33 is a portion of a conventional radio receiver for detecting, processing and amplifying radio signals. Such radio receiver sections are well known to those with ordinary skill in the art. Radio receiver section 33 includes low pass filters 35 and 36 connected in series with tuning stages 37 and 38. The output of tuning stage 38 is applied to a 450K filter, then to an output stage 41 comprising gain elements and an AM detector tied to a automatic gain control loop. The output of radio receiver section 33 is provided at node 44 and may be further amplified, processed or applied to loudspeakers as desired. The noise blanking feature is implemented with N type FET 40 connected to the IF signal output at node 39. By this connection, FET 40 is turned on when a blanking flag is set, thereby grounding the AC signals at node 39 to ground and preventing the flow of AC signals to the 450K signal filter and output stage 41. When the blanking flag is not set, FET 40 is turned off and radio signals flow to output stage 41.

Figure 2:
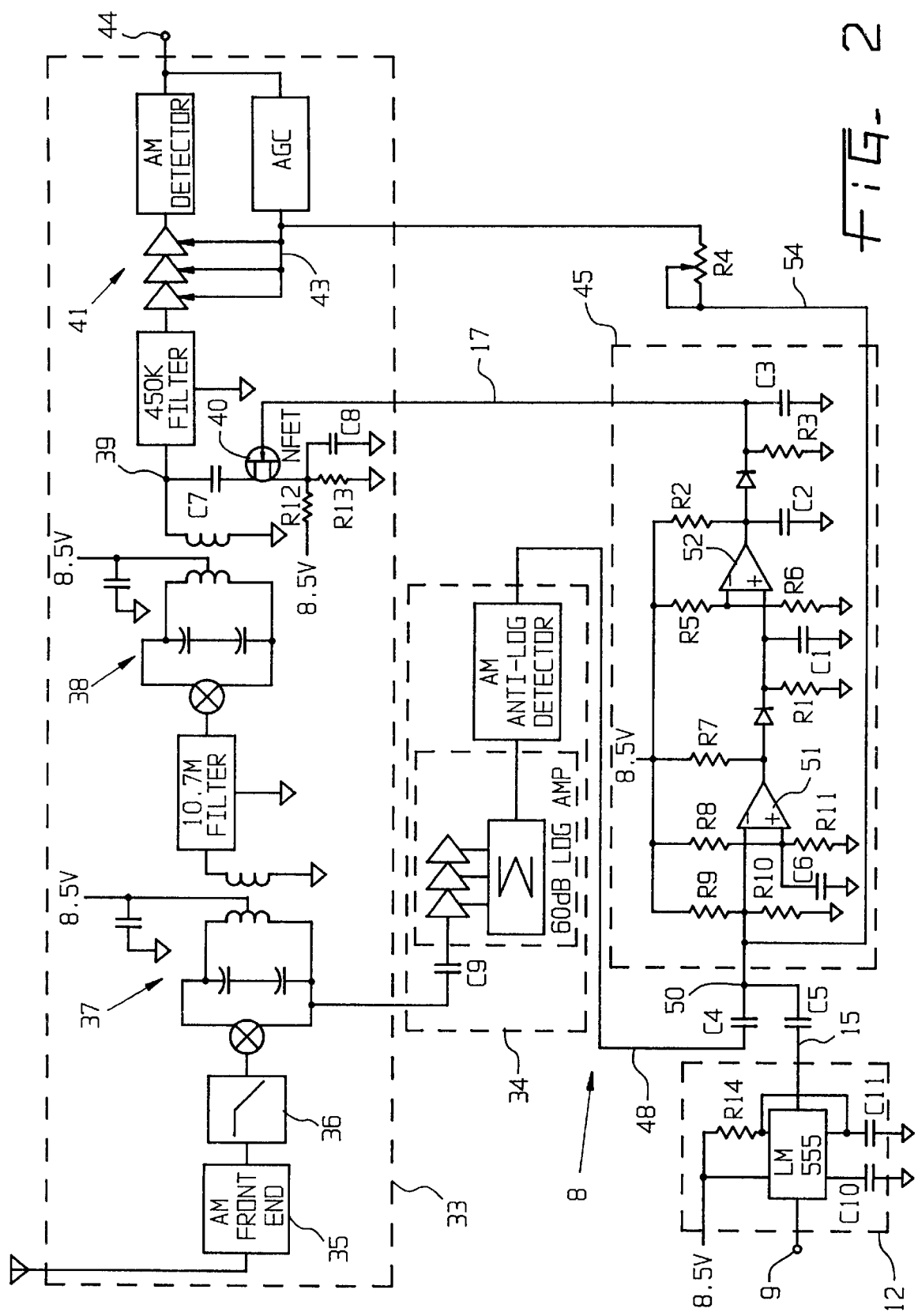
FIG. 2 is a simplified schematic diagram of a noise suppression system of the present invention including portions of the radio receiver, noise detector, signal level detector, pulse former, and noise blanker.

As shown in FIG. 2, the preferred embodiment further includes pulse former 45 which generates uniform blanking flags of a constant duration to activate FET 40. The blanking flags are generated by pulse former 45 in response to trigger signals from output line 48 of noise detector 34 and/or the EST signal via activating input 9 and delay circuit 12. Noise detector 34 sends a signal to trigger pulse former 45 when noise above a predetermined level is detected. The ECM sends a signal to trigger pulse former 45 via delay circuit 12 every time an EST signal is present on ECM output 24. As shown in FIG. 2, delay circuit 12 of the preferred embodiment comprises IC LM555 having a conventional RC network to create the desired time delay. In this case, delay circuit 12 is designed to insert a delay of about 70 $\mu$S.

Uniform blanking flags are used to activate noise blanker 18 to ensure the blanking action does not cause distortions in the output of radio receiver section 33. A uniform noise blanking duration, as well as a uniform blanking rise and fall times ensures smooth and predictable transitions during the start and stop of the blanking feature and prevents audible distortions during these blanking transitions.

The blanking duration is set to ensure that the blanking action does not degrade the signal to an unusable extent. This duration is based on a trade off between having a short blanking duration, which may result in portions of the impulse noise escaping the blanking action, and a long blanking duration, which may result in noticeable gaps in the radio output. Experimental results may be required to establish the proper blanking duration. In the preferred embodiment, a blanking duration of about 40 $\mu$S was found to be sufficient to remove the impulse noise and maintain good audio quality.

Since FET 40 requires a high level signal to place it into a conductive state, the first stage of pulse former 45 detects the falling edge signal at node 50. The blanking signal is detected by comparator 51 of pulse former 45. The resulting positive voltage signal from comparator 51 is converted to a pulse of predetermined duration, rise time and fall time by the second stage using comparator 52 of pulse former 45 by adjusting R1 and C1, R2 and C2, and R3 and C3, respectively. In this embodiment, the values of the resistors and capacitors in the network are designed to create a pulse having a 20 micro-second duration and 5 micro-second rise and fall times.

Additionally, a blanking override signal is provided at input node 50 of pulse former 45 to suppress the noise blanking feature when the signal level is above a certain threshold. This feature is desirable because signal of a predetermined level may be sufficient to block out impulse noise and the operation of a blanking apparatus in such a situation may in fact create annoying audible interruptions. Any number of conventional signal level detectors may be used to implement this feature. In the preferred embodiment, signal level detector 19 comprises adjustable potentiometer R4 which is connected to the AGC output of radio receiver portion 33 at node 43 and the input of pulse former 45 via output line 54. Potentiometer R4 limits the current flow from node 43 to pulse former 45 to set the desired signal threshold level. For example, high resistance is used for a high signal threshold level and low resistance for a low signal threshold level.

The preferred embodiment operates as follows. When noise above a predetermined level is detected by noise detector 34 or ECM 22 generates an EST signal, pulse former 45 generates a blanking flag of a uniform shape and duration. If pulse former 45 is activated by an EST signal, delay circuit 12 inserts a delay of about 70 $\mu$S. The blanking flag is applied to FET 40 to place FET 40 in a conductive state, thereby grounding the AC signals at node 39 to ground, preventing the flow of radio signals to output stage 41. After about 40 $\mu$S, the blanking flag is removed, FET 40 returns to a nonconductive state, and the AC ground at node 39 is removed, thereby allowing the flow of processed radio signals to the 450K signal filter and output stage 41. If at any time the signal level at node 44 is above a predetermined threshold level, a signal applied to node 50 via resistor R4 prevents pulse former 45 from generating a blanking flag.

The noise suppression system of the present invention may be used in conjunction with any other pre-existing noise suppression systems to further suppress noise which is not generated by the engine ignition system.

As described above, radio receiver 10 is blanked in response to the operation of ECM 22. In this manner, the present invention will eliminate all noise due to electromagnetic interference generated by the ignition system, and other noise suppression systems may be added to suppress other unwanted electromagnetic interference (for example, due to power lines, switch pops, electric motor noises, etc.).

While this invention has been described as having an exemplary design, the present invention may be further modified within the spirit and scope of this disclosure. For example, it is obvious that the present invention could be modified by altering the position of the noise blanking circuit. The noise blanking circuit may be integrated into the radio receiver or it may be separately provided, such as, before the signal processing unit or before the loudspeaker units. The position of the noise blanking circuit within the radio receiver circuit may also be altered. Regardless of the specific position of the noise blanking circuit, the objective of effectively eliminating impulse noise is achieved by timing the operation of the noise blanking circuit with the timing of the EST signal.

The present invention may be practiced by using the following values for the circuit elements described above:

| | |
|---|---|
| R1 | 15 KΩ |
| R2 | 1.1 KΩ |
| R3 | 1.5 KΩ |
| R4 | 100K Pot. |
| R5 | 100 KΩ |
| R6 | 15 KΩ |
| R7 | 1 KΩ |
| R8 | 33 KΩ |
| R9 | 33 KΩ |
| R10 | 36 KΩ |
| R11 | 33 KΩ |
| R12 | 10 KΩ |
| R13 | 10 KΩ |
| R14 | 27 KΩ |
| C1 | 220 pf |
| C2 | 1000 pf |
| C3 | 1000 pf |
| C4 | 1000 pf |
| C5 | 1000 pf |
| C6 | .1 µf |
| C7 | .1 µf |
| C8 | .1 µf |
| C9 | .1 µf |
| C10 | .01 µf |
| C11 | 2200 pf |
| Op Amp 51 LM2903 | National Semiconductor P/N |
| Op Amp 52 LM2903 | |
| ECM | 16197427 GM P/N |
| Radio Tuner | 16238903 GM P/N |
| Ignition Coil Driver | 16201599 GM P/N |
| Delay Circuit IC | LM555 National Semiconductor |
| Noise Receiver P/N TEA | 6822 Phillips Semiconductor |

It should be understood that the signals generated by the circuitry of the present invention may take many forms, such as voltage levels as disclosed, logic levels, polarity, current levels, etc.

This application is intended to cover any variations, uses, or adaptations of the invention using its general principles. Further, this application is intended to cover such departures from the present disclosure as come within known or customary practice in the art to which this invention pertains.

We claim:

1. In combination:
   an engine control module (ECM) or other spark timing apparatus for generating a control signal on a control signal output line;
   a vehicle engine ignition system comprising a spark plug, said spark plug firing in response to the generation of said control signal on said control signal output line;
   a radio receiver having an input connected to a radio receiving antenna and an output connected to a loudspeaker, said radio receiver including a first signal processing section and a second signal processing section;
   a noise blanking apparatus including a noise blanker disposed between said first signal processing section and said second signal processing section and an activating input operatively connected to said control signal output line, said noise blanker activated in response to the generation of said control signal on said control signal output line.

2. The combination of claim 1, wherein said noise blanking apparatus further comprises a delay unit disposed between said activating input and said noise blanker, said noise blanker activated after a predetermined time delay following the generation of said control signal on said control signal output line so that the noise blanker is activated when an impulse noise resulting from said spark plug firing arrives at said noise blanker.

3. The combination of claim 1, wherein said noise blanking apparatus further comprises a signal level detector having an input connected to said second signal processing section and an output connected to said noise blanker, said noise blanker being deactivated when said signal level detector output exceeds a predetermined signal level, thereby to override the activation of said noise blanker when the signal level is sufficient to cover up an impulse noise resulting from said spark plug firing.

4. In combination:
   an engine control module (ECM) or other spark timing apparatus having an output;
   a vehicle engine ignition system comprising a spark plug, said spark plug firing in response to the presence of a trigger pulse on said ECM output;
   a radio receiver having an input connected to a radio receiving antenna and an output connected to a loudspeaker, said radio receiver including a first signal processing section and a second signal processing section;
   a noise blanking apparatus including an activating input operatively connected to said ECM output, a delay unit coupled to said activating input, a pulse former coupled to said delay unit, and a noise blanker disposed between said first signal processing section and said second signal processing section, said pulse former providing a blanking flag to activate said noise blanker a predetermined time delay following the presence of said trigger pulse on said ECM output.

5. The combination of claim 4, wherein said noise blanking apparatus further comprises a noise level detector having an input connected to said first signal processing section and an output connected to said pulse former, said pulse former providing said blanking flag to activate said noise blanker when said noise level detector output exceeds a predetermined noise level.

6. The combination of claim 5, wherein said noise blanking apparatus further comprises a signal level detector having an input connected to said second signal processing section unit and an output connected to said pulse former, said pulse former deactivated when said signal level detector output exceeds a predetermined signal level.

7. In combination:
   an engine control module (ECM) for generating a control signal on a control signal output line;
   a vehicle engine ignition system having a spark plug, said spark plug firing in response to the generation of said control signal on said control signal output line;
   a radio receiver having an input connected to a radio receiving antenna and an output connected to a loudspeaker, said radio receiver comprising a first signal processing section and a second signal processing section;
   a noise blanking apparatus including a blanking means disposed between said first signal processing section and said second signal processing section for selectively interrupting the flow of antenna received signals through said radio antenna and an activating input connected to said control signal output line, said noise blanker activated in response to the generation of said control signal on said control signal output line.

8. The combination of claim 7, wherein said noise blanking apparatus further comprises delay means disposed between said activating input and said blanking means for delaying the activation of said blanking means by a predetermined time delay following the presence of said trigger pulse on said control signal output line so that the noise blanker is activated when an impulse noise resulting from said spark plug firing arrives at said noise blanker.

9. The combination of claim 8, wherein said predetermined time delay is about 70 $\mu$S.

10. The combination of claim 7, wherein said noise blanking apparatus further comprises a signal level detector means having an input connected to said second signal processing section and an output connected to said blanking means for deactivating said blanking means when said signal level detector output exceeds a predetermined signal level, thereby to override the activation of said blanking means when the signal level is sufficient to cover up an impulse noise resulting from said spark plug firing.

11. The combination of claim 10, wherein said predetermined signal level is about 500 $\mu$V.

12. In combination:
an engine control module (ECM) having an output;
a vehicle engine ignition system having a spark plug, said spark plug firing in response to the presence of a trigger pulse on said ECM output;
a radio receiver having an input connected to a radio receiving antenna and an output connected to a loudspeaker, said radio receiver comprising a first signal processing section and a second signal processing section;
a noise blanking apparatus including a blanking means disposed between said first signal processing section and said second signal processing section for selectively interrupting the flow of antenna received signals through said radio antenna, an activating input for indicating the presence of said trigger pulse on said ECM output, delay means coupled to said activating input for delaying the indication of said activating input by a predetermined time delay, and pulse former means connected between said delay means and said blanking means for providing a blanking flag to activate said blanking means a predetermined time delay following the indicated presence of said trigger pulse on said ECM output.

13. The combination of claim 12, wherein said blanking flag is a uniform pulse having a duration of about 40 mS.

14. The combination of claim 13, wherein said noise blanking apparatus further comprises noise level detector means having an input connected to said first signal processing section and an output connected to said pulse former for activating said pulse former to provide said blanking flag to said blanking means when said noise level detector output exceeds a predetermined noise level.

15. The combination of claim 14, wherein said noise blanking apparatus further comprises a signal level detector means having an input connected to said second signal processing section and an output connected to said pulse former for deactivating said pulse former when said signal level detector output exceeds a predetermined signal level.

16. A method for suppressing noise in a vehicle radio receiver caused by electromagnetic interference generated by the firing of a spark plug, comprising the steps of:
generating an ignition control signal in an electronic control module (ECM) to activate the firing of a spark plug;
detecting the generation of the control signal; and
interrupting the flow of antenna received signals through the radio receiver for a period of time in response to detecting the control signal.

17. The method of suppressing noise in accordance with claim 16, wherein said interrupting step further comprises waiting a predetermined time delay after detecting the generation of the control signal before interrupting the flow of antenna receive signals so that the interruption of antenna received signals occurs when an impulse noise resulting from said spark plug firing arrives at said radio receiver.

18. The method of suppressing noise in accordance with claim 17, wherein said predetermined time delay is about 70 $\mu$S.

19. The method of suppressing noise in accordance with claim 16, further comprising a step of detecting noise level and interrupting the flow of antenna received signals when the detected noise level exceeds a predetermined noise level.

20. The method of suppressing noise in accordance with claim 16, further comprising a step of detecting a radio signal level and permitting the flow of antenna received signals when the detected radio signal level exceeds a predetermined signal level, thereby to override the interrupting of antenna received signals when the signal level is sufficient to cover up an impulse noise resulting from said spark plug firing.

21. The method of suppressing noise in accordance with claim 20, wherein said predetermined signal level is about 500 $\mu$V.

22. A method for suppressing noise in a vehicle radio receiver caused by electromagnetic interference generated by the firing of a spark plug, comprising the steps of:
generating an ignition trigger signal in an electronic control module (ECM) to activate the firing of a spark plug;
detecting the generation of the trigger signal;
generating a uniform blanking flag of a predetermined duration in response to detecting the trigger signal;and
interrupting the flow of antenna received signals through the radio receiver for a period of time proportional to the predetermined duration.

23. The method of suppressing noise in accordance with claim 22, wherein said uniform blanking flag has a duration of about 40 $\mu$S.

* * * * *